United States Patent
Hashimoto et al.

(10) Patent No.: US 8,197,993 B2
(45) Date of Patent: Jun. 12, 2012

(54) METHOD OF MANUFACTURING TRANSFER MASK AND METHOD OF MANUFACTURING SEMICONDUCTOR DEVICE

(75) Inventors: Masahiro Hashimoto, Tokyo (JP); Kazuya Sakai, Tokyo (JP); Toshiyuki Suzuki, Tokyo (JP); Kazunori Ono, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

(21) Appl. No.: 13/122,680

(22) PCT Filed: Oct. 8, 2010

(86) PCT No.: PCT/JP2010/067733
§ 371 (c)(1),
(2), (4) Date: May 5, 2011

(87) PCT Pub. No.: WO2011/046075
PCT Pub. Date: Apr. 21, 2011

(65) Prior Publication Data
US 2011/0217635 A1    Sep. 8, 2011

(30) Foreign Application Priority Data
Oct. 12, 2009  (JP) .................................. 2009-235818

(51) Int. Cl.
G03F 1/00    (2012.01)
B08B 3/00    (2006.01)
(52) U.S. Cl. ................................. 430/5; 134/26; 134/36
(58) Field of Classification Search .............. 430/5, 311; 250/492.21; 216/66
See application file for complete search history.

(56) References Cited

U.S. PATENT DOCUMENTS

| | | | |
|---|---|---|---|
| 6,627,363 B1* | 9/2003 | Wen et al. | ........................ 430/5 |
| 7,896,970 B2* | 3/2011 | Tomita et al. | .................. 134/1.3 |
| 2007/0212618 A1 | 9/2007 | Yoshikawa et al. | |
| 2007/0248897 A1 | 10/2007 | Yoshikawa et al. | |
| 2008/0063950 A1 | 3/2008 | Yoshikawa et al. | |

FOREIGN PATENT DOCUMENTS
JP        09-211839 A    8/1997
(Continued)

Primary Examiner — Stephen Rosasco
(74) Attorney, Agent, or Firm — Sughrue Mion, PLLC

(57) ABSTRACT

The present invention is a method of manufacturing a transfer mask with use of a mask blank in which a thin film for pattern formation and a chromium-based thin film made of a material containing chromium are stacked on a transparent substrate in this order. The thin film for pattern formation is made of material containing silicon and a transition metal other than chromium. The chromium-based thin film is made of a material containing chromium. Exposure light having a wavelength of 200 nm or less is applied to the transfer mask. In the manufacturing method, the transfer mask is produced by performing, in the following order, a process of forming a resist film having a transfer pattern on the chromium-based thin film, a process of forming a transfer pattern in the chromium-based thin film with use of a mask of the resist film having the transfer pattern, a process of forming a transfer pattern in the thin film for pattern formation with use of a mask of the chromium-based thin film having the transfer pattern, and a process of removing the chromium-based thin film by etching. The manufacturing method further includes a cleaning process of at least one of alkali solution cleaning, hot water cleaning, and ozone-containing water cleaning on the produced transfer mask until a width of the transfer pattern of the thin film for pattern formation is reduced by 4 nm or a space width of the thin film for pattern formation is increased by 4 nm.

17 Claims, 4 Drawing Sheets

FOREIGN PATENT DOCUMENTS

| | | |
|---|---|---|
| JP | 2002-156742 A | 5/2002 |
| JP | 2006-078807 A | 3/2006 |
| JP | 2007-241060 A | 9/2007 |
| JP | 2007-241065 A | 9/2007 |
| JP | 2007-292824 A | 11/2007 |
| WO | 2008/139904 A1 | 11/2008 |

* cited by examiner

METHOD OF MANUFACTURING TRANSFER MASK AND METHOD OF MANUFACTURING SEMICONDUCTOR DEVICE

CROSS REFERENCE TO RELATED APPLICATION

This application is a National Stage of International Application No. PCT/JP2010/067733 filed Oct. 8, 2010, claiming priority based on Japanese Patent Application No. 2009-235818, filed Oct. 12, 2009, the contents of all of which are incorporated herein by reference in their entirety.

TECHNICAL FIELD

The present invention relates to a transfer mask having improved light resistance and to a method of manufacturing a transfer mask. More particularly, the present invention relates to a method of manufacturing a transfer mask suitably used for an exposure apparatus using an exposure light source of exposure light having a short wavelength of 200 nm or less and to a method of manufacturing a semiconductor device.

BACKGROUND ART

Generally, in a manufacturing process of a semiconductor device, fine patterns are formed by using photolithography. Furthermore, several sheets of transfer masks (photomasks) are generally used for formation of those fine patterns. Generally, a transfer mask is produced by providing fine patterns formed of a metallic thin film or the like on a transparent substrate. Photolithography is also used in a process of manufacturing a transfer mask.

For manufacturing a transfer mask by using photolithography, a mask blank having a thin film (e.g., a light-shield film) is used to form a transfer pattern (mask pattern) on a transparent substrate such as a glass substrate.

The production of a transfer mask using a mask blank includes an exposure process of drawing a desired pattern on a resist film formed on a mask blank, a development process of developing the resist film according to the desired pattern being drawn to thereby form a resist pattern, an etching process of etching a thin film according to the resist pattern, and a process of separating and removing the remaining resist pattern.

In the aforementioned development process, a desired pattern is drawn (exposed) on the resist film formed on the mask blank, and a developing solution is then supplied to dissolve a portion of the resist film that is soluble in the developing solution. Thus, a resist pattern is formed. Furthermore, in the aforementioned etching process, an exposed portion of the thin film on which no resist pattern is formed is dissolved by dry etching or wet etching with use of a mask of the resist pattern. Thus, a desired transfer pattern is formed on a transparent substrate. In this manner, a transfer mask is produced.

Not only a finer transfer pattern formed in a transfer mask, but also a shortened wavelength of an exposure light source used for photolithography is required in order to form a finer pattern of a semiconductor device. In recent years, the wavelength of exposure light sources used for manufacturing a semiconductor device has gradually been shortened from a KrF excimer laser (with a wavelength of 248 nm) to an ArF excimer laser (with a wavelength of 193 nm).

Furthermore, a half-tone type phase shift mask has been known as a transfer mask other than a conventional binary mask having a light-shield film pattern formed of a chromium-based material on a transparent substrate. The half-tone type phase shift mask has a semitransparent film (half-tone type phase shift film) on a transparent substrate. The semitransparent film permits light having an intensity that does not substantially contribute to exposure to pass therethrough (for example, 1% to 20% to the exposure wavelength) and provides a predetermined phase difference to the transmitted light. For example, a material containing a molybdenum silicide compound or the like is used for the semitransparent film. The half-tone type phase shift mask includes a semitransparent part in which a semitransparent film has been patterned and a transparent part that has no semitransparent film and permits exposure light to pass therethrough. With the semitransparent part and the transparent part, the phase of light transmitted through the semitransparent part substantially has an inversed relationship with respect to the phase of light transmitted through the transparent part (i.e., the phase is shifted). Thus, light rays that have passed near a boundary portion between the semitransparent part and the transparent part and entered the counterpart area due to a diffraction phenomenon cancel out, so that the light intensity becomes nearly zero at the boundary portion. Thus, the half-tone type phase shift mask improves the contrast, i.e., the resolution at the boundary portion.

Furthermore, transfer patterns become finer in the exposure technology using exposure light of an ArF excimer laser (with a wavelength of 193 nm). Therefore, it is necessary to cope with a line width of a pattern that is shorter than the wavelength of the exposure light. Thus, there have been developed super-resolution technology, such as an oblique illumination projection method and a phase shift method, and ultrahigh-NA technology (immersion lithography or the like) where NA (Numerical Aperture)=1 or more.

As transfer patterns become finer, the width of resist patterns becomes narrower. Therefore, the aspect ratio becomes high with the film thickness of a conventional resist film. Therefore, it is getting difficult to form a transfer pattern by dry-etching a light-shield film with use of a mask of the resist pattern.

As one of solutions for this problem, there has been developed a binary mask blank in which a light-shield film is formed of a film containing a transition metal and silicon so that the light-shield film can be dry-etched with a fluorine-based gas and in which an etching mask film of a chromium-based material is formed on the light-shield film (Patent Document 1). A method of producing a transfer mask from this mask blank includes first forming a resist pattern on the etching mask film, dry etching with an etching gas of a mixture gas of chlorine and oxygen while using a mask of the resist pattern, and forming a transfer pattern in the etching mask film. Then dry etching is conducted with an etching gas of a fluorine-based gas while using the transfer pattern of the etching mask film as a mask, thereby forming a transfer pattern in the light-shield film. Thereafter, the etching mask film is removed. A binary transfer mask is produced through a predetermined cleaning process.

PRIOR ART DOCUMENTS

Patent Documents

Patent Document 1: JP-A 2007-241060
Patent Document 2: JP-A 2002-156742

SUMMARY OF THE INVENTION

Problem(s) to be Solved by the Invention

Meanwhile, the manufacturing cost of transfer masks, such as binary masks and half-tone type phase shift masks, has considerably increased along with recent miniaturization of patterns. Therefore, there have grown needs to extend the lifetime of transfer masks.

Factors to determine the lifetime of a transfer mask is a problem of degradation of a transfer mask because of repeated use of the transfer mask with repeated cleaning. In conventional technology, when a haze (foreign matter that is formed primarily of ammonium sulfide and generated on a transfer mask) is generated, cleaning is conducted for removing the haze. However, the film is unavoidably reduced (eluted) by the cleaning. Thus, the number of cleaning processes being performed determines the lifetime of the transfer mask.

In recent years, the number of cleaning processes of a transfer mask has been reduced by improvement of the haze countermeasure technology. Thus, a period for which a transfer mask can repeatedly be used is being extended. However, since the exposure time is accordingly extended, a new problem of the light resistance to short-wavelength light, particularly light of an ArF excimer laser, has come to the surface.

The inventors have elucidated that, in a case of a binary mask containing a transition metal and silicon, a phenomenon of a varying width (increased width) of a transfer pattern of a light-shield film occurs if the binary mask is accumulatively irradiated with an exposure light source of an ArF excimer laser (having a wavelength of 193 nm) beyond a repeatable use period of a conventional transfer mask. The inventors have found out that such a line width variation deteriorates the CD (Critical Dimension) precision of a transfer mask and, eventually, the CD precision of a wafer to be subjected to transfer, and hence inhibits further extension of the lifetime of a transfer mask.

Furthermore, the inventors have elucidated that irradiation of an exposure light source of an ArF excimer laser (having a wavelength of 193 nm) causes a phenomenon of a varied width of a transfer pattern of a half-tone type phase shift film and also causes variations of the transmittance and the amount of phase shift. In the case of a half-tone type phase shift mask, such variations of the transmittance and the amount of phase shift are a critical problem that exerts an influence on the capability of the transfer mask. If the transmittance varies to a large extent, then the transfer precision is deteriorated. If the amount of phase shift varies to a large extent, then the phase shift effect is unlikely to be obtained at a boundary portion of the pattern. As a result, the contrast is lessened at the boundary portion of the pattern, and the resolution is greatly lowered.

In order to improve the light resistance of a semitransparent film (half-tone type phase shift film), for example, there has heretofore been technology of performing a heat treatment on a semitransparent film containing a transition metal and silicon as principal components in the air or in an oxygen atmosphere at 250° C. to 350° C. for 90 minutes to 150 minutes (Patent Document 2). However, the inventors' study has revealed that this technology does not suffice.

The present invention has been made in view of the above background. It is an object of the present invention to provide a method of manufacturing a transfer mask in which, when exposure light having a wavelength 200 nm or less, such as ArF excimer laser, is applied to the transfer mask, variation of the width of a transfer pattern in a thin film for pattern formation, transmittance variation, and variation of the amount of phase shift caused by irradiation of the exposure light for a long term are suppressed, i.e., a transfer mask having high resistance to ArF exposure. Furthermore, another object of the present invention is to provide a method of manufacturing a semiconductor device using a transfer mask produced by such a method of manufacturing a transfer mask.

Means to Solve the Problem(s)

The present invention has the following structures.
(Structure 1)
A method of manufacturing a transfer mask with use of a mask blank in which a thin film for pattern formation and a chromium-based thin film made of a material containing chromium are stacked on a transparent substrate in this order, the thin film for pattern formation being made of material containing silicon and a transition metal other than chromium, the chromium-based thin film being made of a material containing chromium, wherein:
the transfer mask is adapted to an exposure light having a wavelength of 200 nm or less; and
the transfer mask is produced by performing in the following order:
a process of forming a resist film having a transfer pattern on the chromium-based thin film,
a process of forming a transfer pattern in the chromium-based thin film with use of a mask of the resist film having the transfer pattern,
a process of forming a transfer pattern in the thin film for pattern formation with use of a mask of the chromium-based thin film having the transfer pattern, and
a process of removing the chromium-based thin film by etching; and
a cleaning process of at least one of alkali solution cleaning, hot water cleaning, and ozone-containing water cleaning on the produced transfer mask until a width of the transfer pattern of the thin film for pattern formation is reduced by 4 nm or a space width of the thin film for pattern formation is increased by 4 nm.
(Structure 2)
The method of manufacturing a transfer mask as recited in the structure 1, wherein the cleaning process includes conducting the alkali solution cleaning, the hot water cleaning, and the ozone-containing water cleaning in order named.
(Structure 3)
The method of manufacturing a transfer mask as recited in the structure 1 or 2, wherein the alkali solution comprises an aqueous solution containing ammonia and hydrogen peroxide.
(Structure 4)
The method of manufacturing a transfer mask as recited in any one of the structures 1 to 3, wherein:
the thin film for pattern formation comprises a light-shield film having an optical density of 2.5 or more, and
the chromium-based thin film is entirely removed by the removal process of etching.
(Structure 5)
The method of manufacturing a transfer mask as recited in the structure 4, wherein the thin film for pattern formation comprises a light-shield film having a stacked structure of at least two layers of a light-shield layer and a front-face anti-reflection film from a side of the transparent substrate.
(Structure 6)
The method of manufacturing a transfer mask as recited in any one of the structures 1 to 5, wherein the thin film for pattern formation has a transfer pattern following a DRAM hp 45-nm generation.
(Structure 7)
The method of manufacturing a transfer mask as recited in any one of the structures 1 to 3, wherein:

the thin film for pattern formation comprises a half-tone type phase shift film, the chromium-based thin film and the thin film for a transfer pattern have a stacked structure with an optical density of at least 2.5, and the chromium-based thin film is removed from an area other than a light-shield band area around the transfer pattern in the process of removing the chromium-based thin film by etching.

(Structure 8)

The method of manufacturing a transfer mask as recited in any one of the structures 1 to 7, wherein the transition metal in the thin film for pattern formation is molybdenum.

(Structure 9)

A method of manufacturing a semiconductor device using a transfer mask produced by the method of manufacturing a transfer mask as recited in the structure 6 to form a circuit pattern on a semiconductor wafer.

(Structure 10)

The method of manufacturing a semiconductor device as recited in the structure 9, wherein the circuit pattern formed on the semiconductor wafer includes a circuit pattern following a DRAM hp 45-nm generation.

(Structure 11)

A method of manufacturing a semiconductor device, using a transfer mask produced by the method of manufacturing a transfer mask as recited in the structure 7 or 8 to form a circuit pattern on a semiconductor wafer.

Effect(s) of the Invention

According to the present invention, a cleaning process of at least one of alkali solution cleaning, hot water cleaning, and ozone-containing water cleaning is performed on the produced transfer mask until the width of the transfer pattern of the thin film for pattern formation is reduced by 4 nm or a space width of the thin film for pattern formation is increased by 4 nm. Thus, a chromium residue (the chromium residual concentration in the thin film for pattern formation) can be reduced. As a result, even in a case where the thin film for pattern formation is continuously irradiated with an ArF excimer laser, which has a wavelength of 200 nm or less, so that the total amount of irradiation is 40 kJ/cm$^2$, the amount of CD variation of the width of the transfer pattern in the thin film for pattern formation can be reduced to a large extent. (The CD variation can be reduced to ¼ or less, and the amount of CD variation can be reduced to 5 nm or less.)

According to the present invention, there can be provided a transfer mask and a method of manufacturing a transfer mask in which the light resistance of a thin film for pattern formation that is made of a material containing a transition metal other than chromium and silicon is improved in a case where the transfer mask is accumulatively irradiated with exposure light having a wavelength of 200 nm or less beyond a repeatable use period of a conventional transfer mask, and the lifetime of the transfer mask is improved. Furthermore, there can be provided a method of manufacturing a semiconductor device with use of the transfer mask produced by the method of manufacturing a transfer mask according to the present invention.

MODE FOR CARRYING OUT THE INVENTION

The present invention will be described below in detail.

The inventors supposed that the following is a cause of considerable degradation of a transfer mask because of repeated use of the transfer mask along with a shortened wavelength of an exposure light source.

Figure 5:
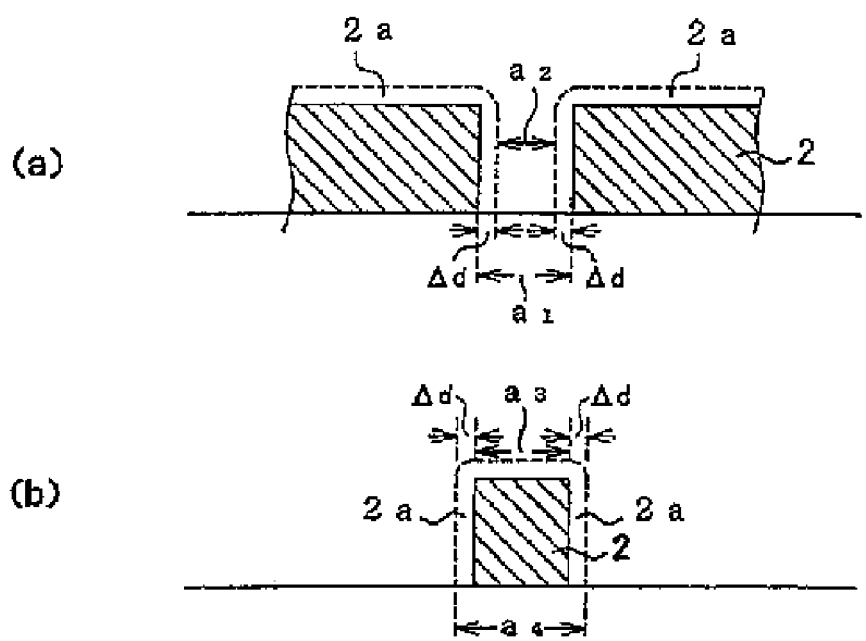
FIG. 5 shows, in (a) and (b), schematic diagrams explanatory of CD variation of the width of a transfer pattern by an affected layer.

The inventors examined a pattern of a thin film for pattern formation that contained a transition metal and silicon in a transfer mask in which a variation of the width of a transfer pattern (CD variation) occurred because of repeated use of the transfer mask. As a result, as shown in FIG. 5 (a) and FIG. 5 (b), an affected layer 2a, which included Si, O, and a slight amount of metal (e.g., Mo), was generated on a front surface of a thin film 2 (a transition metal silicide based thin film, e.g., a MoSi-based film) containing a transition metal and silicon. The inventors have elucidated that this affected layer is one of primary causes for variation (increase) Δd of the width of a transfer pattern and for variation of the transmittance and the amount of phase shift.

The reasons (mechanisms) why such an affected layer was generated are conceivably as follows: Specifically, a conventional transition metal silicide based thin film 2 deposited by sputtering has gaps in structure. A change of the structure of the transition metal silicide based thin film 2 is small even if annealing is conducted after the deposition. Therefore, oxygen ($O_2$) or water ($H_2O$) in the air or the like enters those gaps during use of a transfer mask. Furthermore, ozone ($O_3$) or the like that has been generated when oxygen ($O_2$) in the air reacted with an ArF excimer laser also enters the gaps. Those substances react with Si or the transition metal M (e.g., Mo) included in the transition metal silicide based thin film 2.

Specifically, under such an environment, Si and the transition metal M included in the transition metal silicide based thin film 2 are excited and brought into a transition state when they receive irradiation of exposure light (particularly short-wavelength light such as ArF). Then Si oxidizes and expands (because $SiO_2$ has a larger volume than Si). Simultaneously, the transition metal M also oxidizes, so that an affected layer 2a is generated on a surface of the transition metal silicide based thin film 2. At that time, the quality of a Si oxide film generated varies depending upon the amount of water in the air (the humidity). As the humidity is higher, a Si oxide film is formed with a lower density. If a transfer mask is repeatedly used in an environment in which a low-density Si oxide film is formed, oxidation and expansion of Si further proceed with cumulative irradiation of the exposure light. The transition metal M oxidized at an interface between a non-affected layer and the affected layer 2a of the transition metal silicide based thin film 2 is diffused in the affected layer 2a, deposited onto a surface of the affected layer 2a, and sublimated into an oxide of the transition metal M (e.g., $MoO_3$). The density of the affected layer 2a is further lowered and brought into such a state that the affected layer 2a is likely to oxidize. As a result, it is conceivable that the thickness of the affected layer 2a gradually increases (a ratio of the affected layer 2a in the transition metal silicide based thin film 2 increases).

Such a phenomenon in which an affected layer 2a is generated and developed is noticeably seen when a transition metal silicide based thin film 2 is irradiated for a long time with exposure light having a wavelength of 200 nm or less, such as an ArF excimer laser, that has an energy required for Si and a transition metal M of the transition metal silicide based thin film 2 to be excited and brought into a transition state, which triggers an oxidation reaction of Si and the transition metal M.

With the above mechanism, a variation of the width of the transfer pattern (CD increase), which is conceivably caused by oxidation of silicon (Si) in the film, is seen in the transition metal silicide based thin film for pattern formation.

The inventors more diligently studied causes for generation of an affected layer on a transition metal silicide based thin film for pattern formation. As a result, the inventors have found that the presence of a thin film of a chromium-based material stacked on a thin film for pattern formation (a light-shield film for forming an etching mask film, a light-shield band, or the like) exerts a great influence on generation of an affected layer. Specifically, mask blanks having a transition metal silicide based thin film for pattern formation that had the same film structure were first prepared. One of the mask blanks included a chromium-based thin film stacked on the thin film for pattern formation, and the other of the mask blanks included no chromium-based thin film stacked on the thin film for pattern formation. For the mask blank having the chromium-based thin film, while the transfer pattern of the chromium-based thin film was used as a mask, dry etching was then conducted on the thin film for pattern formation with a fluorine-based gas to form a transfer pattern. Thereafter, the chromium-based thin film was removed by dry etching with a mixture gas of chlorine and oxygen, and a conventional cleaning process was performed. Thus, a transfer mask was produced. Meanwhile, for the mask blank having no chromium-based thin film, while a resist pattern was used as a mask, dry etching was conducted on the thin film for pattern formation with a fluorine-based gas to form a transfer pattern. Thereafter, the resist pattern was removed, and a conventional cleaning process was performed. Thus, a transfer mask was produced. Those two transfer masks were examined with a long-term irradiation of ArF exposure light under the same conditions (cumulative amount of irradiation: 40 kJ/cm$^2$, pulse frequency: 300 Hz). As a result, the amount of variation of the width of the transfer pattern of the transfer mask produced from the mask blank having no chromium-based thin film (the amount of CD variation) was about 1 nm and was not problematical for continuous use. In contrast, the amount of variation of the width of the transfer pattern of the transfer mask produced from the mask blank having the chromium-based thin film (the amount of CD variation) was 15.9 nm and was considerably problematical for continuous use.

Figure 2:
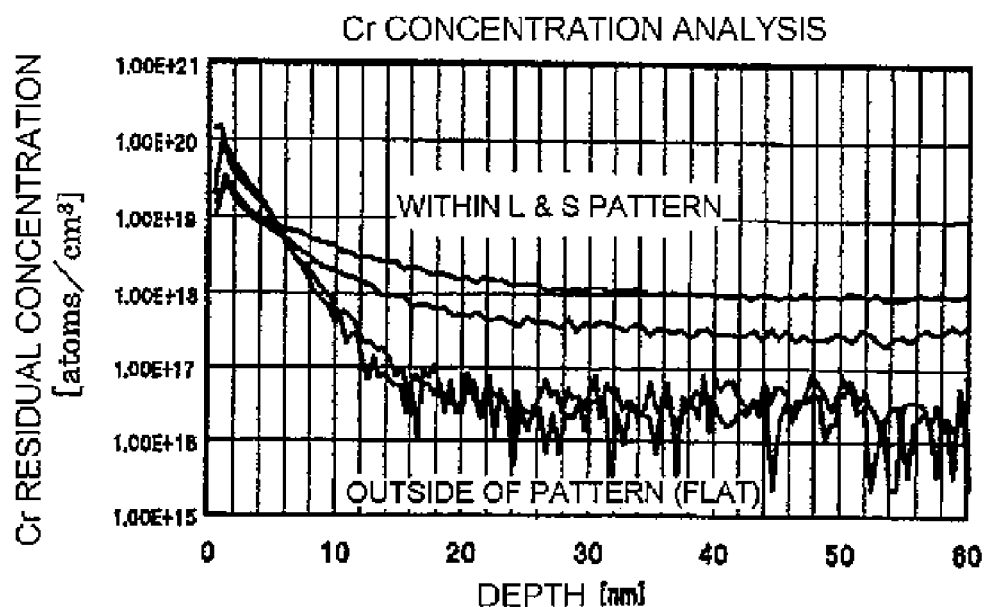
FIG. 2 is a graph showing the result of analysis of the chromium concentration by D-SIMS.

A transfer mask that demonstrated a large variation in pattern width was produced again under the same conditions. No irradiation of ArF exposure light was performed, and secondary ion mass spectrometry (SIMS) was used in a dynamic mode (D-SIMS), in which a sample is measured while it is being shaved. A substance in a thin film for pattern formation that was not included in composition at the time of deposition of the thin film for pattern formation, i.e., a residual substance attached (remained) during a production process of the transfer mask, was examined. As a result, residual concentrations of chromium and chlorine in the thin film for pattern formation were found to be high. Furthermore, in order to examine where and how the residual substance was present, the concentrations of the residual substance in a non-pattern area (so-called a "flat" area or an area in which no sidewall portion of the transfer pattern was present) and in an area including lines and spaces (an area in which a sidewall portion of the transfer pattern was present) were measured in a dynamic mode (D-SIMS). As a result, the concentration of the residual substance in the non-pattern area (so-called the "flat" area) was high on a surface layer and decreased sharply in the depth direction. From this fact, the residual substance (Cr) was found to be present on the surface layer (see FIG. 2). Furthermore, the concentration of the residual substance in the area including lines and spaces was high on a surface layer in the same manner as described above. However, the concentration of the residual substance did not decrease much in the depth direction after the surface layer had been removed. Thus, the residual substance (Cr) was found to be present with a high concentration on the sidewall portion of the pattern (see FIG. 2). In the D-SIMS of FIG. 2, $O_2$ was used as primary ions.

Figure 3:
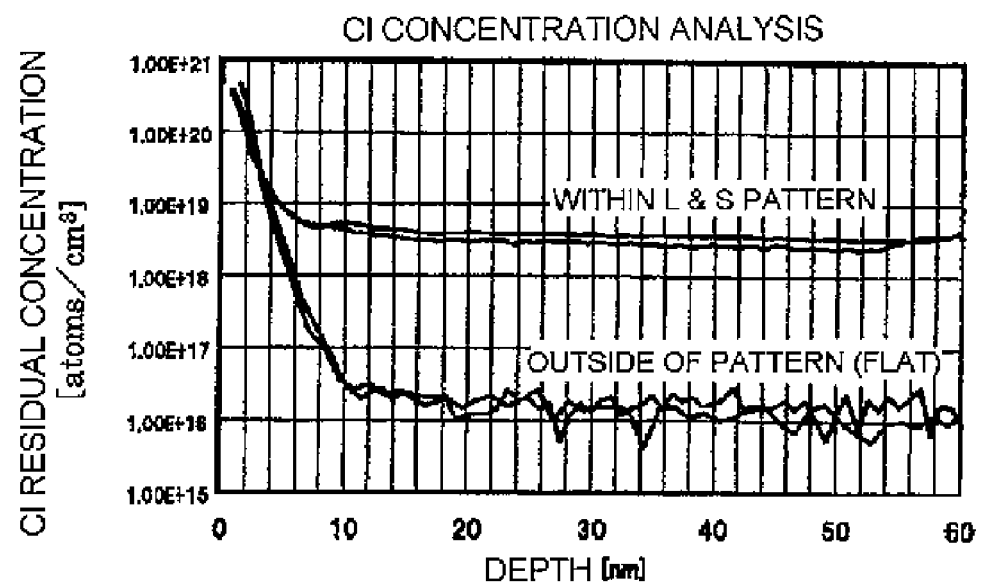
FIG. 3 is a graph showing the result of analysis of the chlorine concentration by D-SIMS.

Furthermore, FIG. 3 shows the measurement results of the residual concentration of chlorine in the D-SIMS as in the case of chromium. In the D-SIMS of FIG. 3, Cs was used as primary ions. In order to examine the influence of the residual concentration of chlorine on the affected layer, a period of dry etching was lengthened at the time of removal of the chromium-based thin film. Thus, the chlorine residual concentration was intentionally increased at the sidewalls of the transfer pattern. Irradiation of ArF exposure light was performed under the same conditions. As a result, no correlation was found with respect to the width of the affected layer (the amount of CD variation).

It has been found from the results of the D-SIMS and the like that the residual substance concentration of Cr is high at a sidewall portion of a transfer pattern, to which Cr could not be attached at the time of production of a mask blank, and at portions other than a surface layer of a thin film for pattern formation that contacted a chromium-based thin film. This is conceivably because, at the time of removal of a chromium-based thin film after a thin film for pattern formation is dry-etched with use of a mask of a transfer pattern of the chromium-based thin film to form a transfer pattern, chromium sublimated by the dry etching with a mixture gas of chlorine and oxygen is reattached to the sidewalls of the transfer pattern of the thin film for pattern formation, and is introduced into gaps of a structure of the transition metal and silicon or is bonded to silicon. Thus, it is conceivable that chromium cannot be removed by a conventional cleaning process.

When the transfer mask thus produced is irradiated with ArF exposure light, the remaining chromium is also excited as with a transition metal as a material of the thin film for pattern formation and is brought into a transition state by the ArF exposure light. Thus, the remaining chromium reacts with the remaining chlorine, oxygen in the air, and ozone generated by reaction with the ArF exposure light and sublimates. Since not only the transition metal of the film material but also chromium sublimates so that it is drawn from the sidewall portion of the pattern, more gaps are generated in the affected layer. Thus, the transition metal becomes likely to sublimate from an interface between the non-affected layer and the affected layer in the thin film for pattern formation. With such a mechanism, the inventors have elucidated that the affected layer excessively grows if much chromium remains at the sidewall portion of the pattern. Based upon those elucidated facts and examination, the inventors have focused attention on a chromium residue generated as described above on a sidewall portion of a transfer pattern of a thin film for pattern formation for the purposes of suppressing generation and development of an affected layer. As a result of further diligent study, the inventors have completed the present invention.

A method of manufacturing a transfer mask with use of a mask blank in which a thin film for pattern formation and a chromium-based thin film made of a material containing chromium are stacked on a transparent substrate in this order, the thin film for pattern formation being made of material containing silicon and a transition metal other than chromium, the chromium-based thin film being made of a material containing chromium, wherein:

the transfer mask is adapted to an exposure light having a wavelength of 200 nm or less; and the transfer mask is produced by performing in the following order:

a process of forming a resist film having a transfer pattern on the chromium-based thin film, a process of forming a transfer pattern in the chromium-based thin film with use of a mask of the resist film having the transfer pattern, a process of forming a transfer pattern in the thin film for pattern formation with use of a mask of the chromium-based thin film having the transfer pattern, and a process of removing the chromium-based thin film by etching; and a cleaning process of at least one of alkali solution cleaning, hot water cleaning, and ozone-containing water cleaning is performed on the produced transfer mask until a width of the transfer pattern of the thin film for pattern formation is reduced by 4 nm or a space width of the thin film for pattern formation is increased by 4 nm (Structure 1).

In the present invention, the thin film for pattern formation has a transfer pattern following a DRAM (Dynamic Random Access Memory) hp (half-pitch) 45-nm generation (Structure 6).

The inventors considered that a chromium residue at a sidewall portion of a transfer pattern of a thin film for transfer pattern exerts a great influence on growth of an affected layer. Furthermore, the inventors also considered that a cleaning process that has heretofore been performed could not readily reduce the chromium residual concentration at a sidewall portion of a pattern. As a result, the inventors have reached conclusion that growth of an affected layer can be suppressed by a specific cleaning process that dissolves and removes the sidewall portion of the pattern having a high chromium residual concentration.

Figure 1:
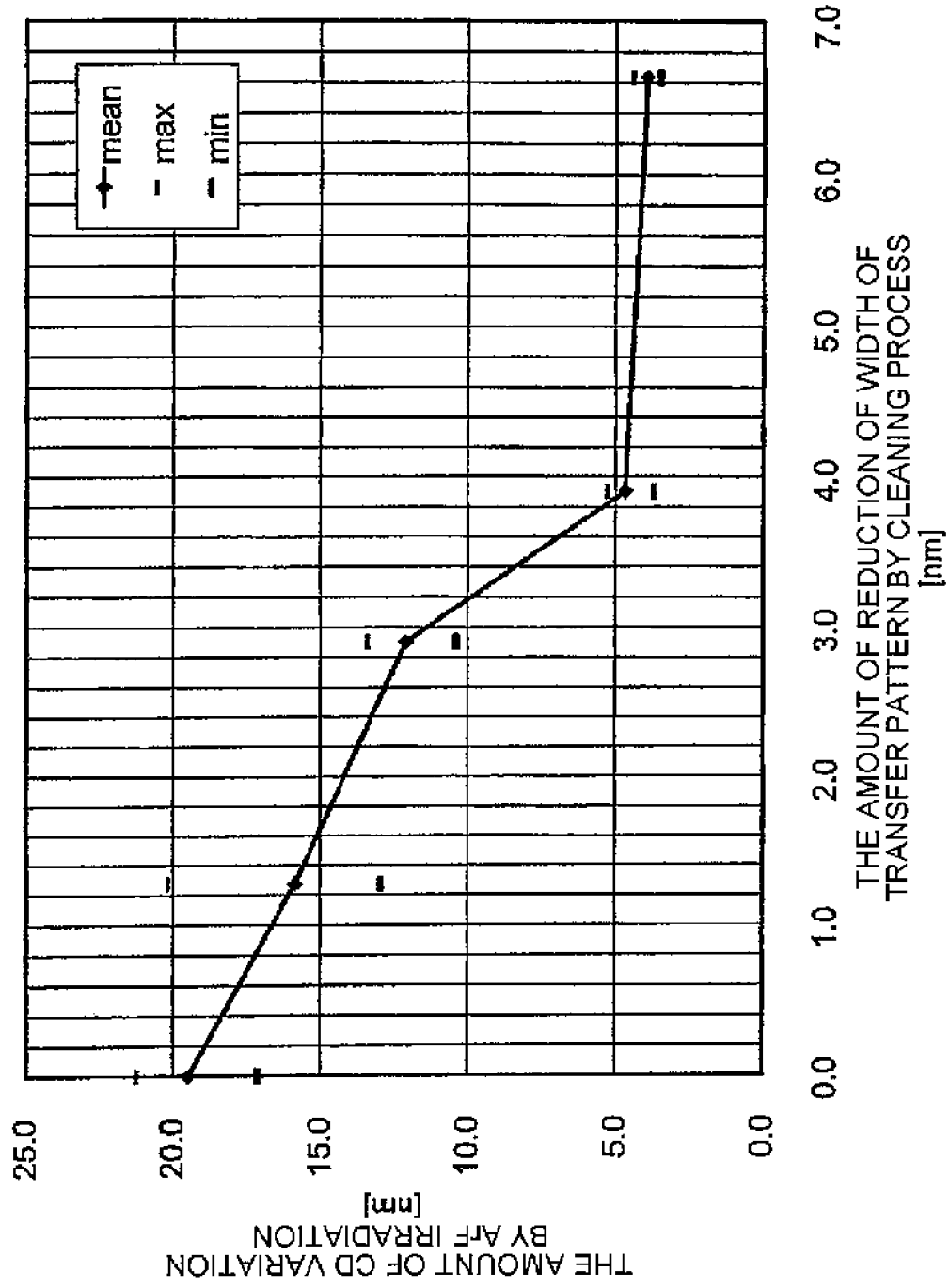
FIG. 1 is a graph showing the relationship between the amount of reduction of the width of a transfer pattern (nm) by cleaning and the amount of CD variation (nm) by irradiation of an ArF excimer laser.

Furthermore, a transfer pattern was formed in the thin film for pattern formation by dry etching with use of a mask of the transfer pattern of the chromium-based thin film. Then a cleaning process was performed with use of the transfer mask from which the chromium-based thin film was removed by etching. The inventors examined the relationship between the amount of removal of the sidewall of the pattern and the amount of variation of the width of the transfer pattern (the amount of CD variation) by irradiation of ArF exposure light (where the total amount of irradiation was 40 kJ/cm$^2$). As a result, as shown in FIG. 1, the inventors have found out that the amount of CD variation can remarkably be suppressed (can be reduced to 5 nm or less) by performing a cleaning process until the width of the transfer pattern is reduced by 4 nm or the space width of the transfer pattern is increased by 4 nm.

For the DRAM hp (half-pitch) 32-nm generation according to the design specifications of semiconductor devices, the CD should be controlled within 2.6 nm or less on a wafer. For this purpose, it is preferable to reduce the amount of CD variation required for a transfer mask used in the hp 32-nm generation to 5 nm or less. The present invention can meet this demand, providing a great benefit.

Figure 4:
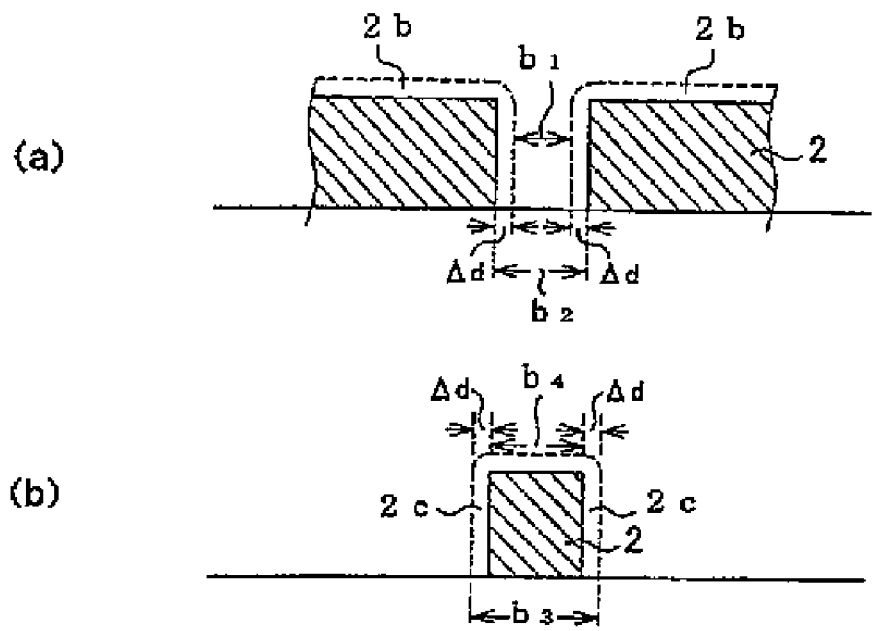
FIG. 4 shows, in (a) and (b), schematic diagrams explanatory of removal of a sidewall portion of a transfer pattern in a thin film for pattern formation.

Transfer patterns formed in a thin film for pattern formation include a line-and-space pattern, an isolated-line pattern, an isolated-space pattern, a dot pattern, a hole pattern, and the like. The isolated-space pattern and the hole pattern have a space shape in cross-section as shown in FIG. 4 (*a*). In this case, a cleaning process is performed until a difference between the space width b1 of the transfer pattern 2*b* prior to the cleaning process and the space width b2 of the transfer pattern 2 after the cleaning process increases by 4 nm. Thus, the sidewall portion of the pattern having a high chromium residual concentration can be dissolved and removed, so that the amount of CD variation can remarkably be suppressed. On the other hand, the isolated-line pattern and the dot pattern have a pattern shape in cross-section as shown in FIG. 4 (*b*). In this case, a cleaning process is performed until a difference between the width b3 of the transfer pattern 2*c* prior to the cleaning process and the width b4 of the transfer pattern 2 after the cleaning process decreases by 4 nm. Thus, the sidewall portion of the pattern having a high chromium residual concentration can be dissolved and removed, so that the amount of CD variation can remarkably be suppressed. The line-and-space pattern is applicable to either FIG. 4 (*a*) or FIG. 4 (*b*).

Only for the purpose of reducing the chromium residual concentration of a sidewall portion of a transfer pattern of a thin film for pattern formation that contains a transition metal other than chromium and silicon, a mask blank may have any structure unless a transfer pattern is formed in a thin film for transfer pattern with use of a mask of a chromium-based thin film. However, under the present circumstances in which transfer patterns have been miniaturized as described above, it is difficult to form a transfer pattern in a thin film for pattern formation with high precision while a resist pattern is used as a mask, particularly in a case of a binary transfer mask following the DRAM hp 45-nm generation. Meanwhile, in a case of a phase shift mask, a light-shield film should be stacked in order to form a light-shield band or the like on a thin film for pattern formation that contains a transition metal other than chromium and silicon. There may be used a method of using a material other than chromium for an etching mask film or a light-shield film. However, a highly reliable material that certainly meets requirements for a high etching selectivity to a thin film for pattern formation that contains a transition metal other than chromium and silicon and for small influence on a thin film for pattern formation at the time of removal by etching cannot readily be found except for a chromium-based material. From those points of view, the present invention is greatly advantageous in removing a sidewall portion of a pattern that has a high chromium residual concentration in a thin film for pattern formation that contains a transition metal other than chromium and silicon.

In the present invention, a thin film for pattern formation refers to a thin film for forming a transfer pattern (mask pattern).

In the present invention, a thin film for pattern formation is intended to be a film of a material containing a transition metal (except chromium) and silicon and is not intended to substantially contain chromium. For example, in a case where a thin film for pattern formation is formed on a transparent substrate by a sputtering method, a sputtering target containing no chromium and a deposition gas containing no chromium are used. Therefore, with regard to the chromium content in a film other than a surface layer of a transfer pattern in a thin film for pattern formation (a surface that contacts a chromium-based thin film and a sidewall portion), a value of the chromium concentration analyzed by the D-SIMS has a level of not more than $1.0 \times 10^{16}$ atom/cm$^3$ (a level that is determined to substantially contain no chromium).

According to the present invention, the amount of CD variation of the width of a transfer pattern of a thin film for pattern formation is defined as $2\Delta d$ as shown in FIG. 5(a) and FIG. 5(b) where the thickness of the affected layer 2a produced on the surface layer of the transfer pattern 2 is $\Delta d$.

FIG. 5(a) shows a case of a space shape such as an isolated-space pattern or a hole pattern. The amount of CD variation=a1-a2=$2\Delta d$.

FIG. 5(b) shows a case of a pattern shape such as an isolated-line pattern or a dot pattern. The amount of CD variation=a4-a3=$2\Delta d$.

The inventors have elucidated the following facts: While a pattern of a chromium-based thin film is used as a mask, a thin film for pattern formation (e.g., a MoSi-based binary film) is patterned by dry etching with a mixture gas of $SF_6$ and He. Then the Cr-based film used as an etching mask is separated and removed by dry etching (with plasma of chlorine and oxygen). Initial cleaning performed after the separation and removal of the Cr-based film exerts a large influence on ArF irradiation resistance and is thus of importance.

The inventors have found out that various kinds of cleaning conducted after the initial cleaning tend to provide no improvement if the initial cleaning is improper. For example, if the initial cleaning is conducted with an acid such as sulfuric acid-hydrogen peroxide mixture or hot concentrated sulfuric acid, various kinds of cleaning conducted after the initial cleaning tend to provide no improvement.

The inventors have found out that at least one cleaning process of alkali solution cleaning, hot water cleaning, and ozone-containing water cleaning is suitable for the initial cleaning. The inventors have found out that those cleaning processes function to dissolve a sidewall portion of a pattern that has a high chromium residual concentration as described above and to remove the dissolved chromium without reintroducing the dissolved chromium into the interior of the transfer pattern. Furthermore, unlike the aforementioned case of the acid cleaning process, those cleaning processes tend to provide improvement if various kinds of cleaning are conducted in a subsequent process.

The inventors have found that, if at least one cleaning process of alkali solution cleaning, hot water cleaning, and ozone-containing water cleaning is applied to the initial cleaning, the chromium residual concentration can be reduced to a desired level in a thin film for pattern formation.

The cleaning process with an alkali solution preferably uses an alkali solution such as an aqueous solution containing ammonia and hydrogen peroxide.

The temperature of the alkali solution is preferably in a range of about 15° C. to about 80° C.

The processing time with the alkali solution is preferably in a range of about 10 minutes to about 20 minutes.

The cleaning process with hot water preferably uses pure water such as ion-exchanged water (DI water: deionized water) or ultrapure water.

The temperature of the hot water is preferably in a range of about 70° C. to about 90° C.

The processing time with the hot water is preferably in a range of about 10 minutes to about 20 minutes.

The cleaning process with ozone-containing water uses water containing 40 ppm to 60 ppm of ozone.

The temperature of the ozone-containing water is preferably in a range of about 15° C. to about 30° C.

The processing time with the ozone-containing water is preferably in a range of about 10 minutes to about 20 minutes.

In the present invention, the cleaning process preferably includes conducting the alkali solution cleaning, the hot water cleaning, and the ozone-containing water cleaning in order named (Structure 2).

The inventors have found that the chromium residual concentration of the thin film for pattern formation can efficiently be reduced to a desired level by conducting the alkali solution cleaning, the hot water cleaning, and the ozone-containing water cleaning in order named.

In the present invention, the alkali solution preferably comprises an aqueous solution containing ammonia and hydrogen peroxide (Structure 3).

The inventors have found that the aforementioned Cr residue can certainly be reduced with great efficiency when the alkali solution comprises an aqueous solution containing ammonia and hydrogen peroxide.

For example, a solution of ammonium hydroxide ($NH_4OH$ having a concentration of 25 wt %):hydrogen peroxide ($H_2O_2$ having a concentration of 30 wt %):water ($H_2O$)=2:1:4 (volume ratio) is preferably used as the aqueous solution containing ammonia and hydrogen peroxide.

In the thin film for pattern formation that is made of a material containing a transition metal other than chromium and silicon according to the present invention, the transition metal (M) may be one of molybdenum (Mo), tantalum (Ta), tungsten (W), titanium (Ti), zirconium (Zr), vanadium (V), niobium (Nb), nickel (Ni), palladium (Pd), ruthenium (Ru), rhodium (Rh), and hafnium (Hf), or an alloy thereof.

In the present invention, the thin film for pattern formation includes a material containing nitrogen, oxygen, carbon, hydrogen, or inert gas (helium, argon, xenon, or the like) in addition to the transition metal and silicon.

In the present invention, the chromium-based thin film may be a simple substance of chromium or may include chromium and at least one element of oxygen, nitrogen, carbon, and hydrogen (a film containing chromium as a principal component or a material containing Cr).

In the present invention, the thin film for pattern formation may be a light-shield film in a binary mask or a half-tone type phase shift film. Furthermore, the thin film for pattern formation may be a thin film that permits exposure light to pass therethrough with such a predetermined transmittance that a resist film to which a pattern is to be transferred is not exposed to the light. The thin film for pattern formation may be a semitransparent film adjusted such that no phase difference is produced between exposure light transmitted through the thin film and exposure light transmitted through a portion having no thin film. A mask blank to which this type of semitransparent film is applied is often used for producing an enhancer mask. Since this semitransparent film has a certain transmittance to exposure light, a resist film may be exposed to light if an overlay exposure is performed at the time of exposure to the resist film, to which a pattern is to be transferred, in an exposure apparatus. Therefore, a film structure in which a light-shield film for forming a light-shield band is stacked on a semitransparent film is used in many cases.

The present invention covers an aspect in which the thin film for pattern formation comprises a light-shield film having an optical density of 2.5 or more, and the chromium-based thin film is entirely removed by the removal process of etching (Structure 4).

In this case, the chromium-based thin film is used as an etching mask and entirely removed after the use. The transfer mask is used as a binary mask.

In a case of a binary mask, the light-shield film in a pattern transfer area should have an optical density of at least 2.5 in order to cope with single exposure. According to Structure 4, this requirement is met. Higher light-shield capability is required for a light-shield film depending upon the structure of an exposure apparatus, sensitivity characteristics of a resist film on a wafer to which a transfer pattern is to be transferred, or the like. Therefore, the optical density is preferably at least 2.8. If the optical density is at least 3.0, it is possible to cope with various environments in which a mask is used.

When a transfer pattern is to be formed in a resist film or the like on a wafer by exposure of ArF exposure light after a transfer mask is provided on a mask stage of an exposure apparatus, then the ArF exposure light is irradiated from a side of a transparent substrate, transmitted through a space portion having no thin film for pattern formation in an area in which a transfer pattern is formed, and emitted to a reducing optical system. Therefore, in a case of a binary mask, which requires no light-shield patch to be provided, it is preferable to remove the chromium-based thin film from at least an area in which the transfer pattern is formed. It is the most preferable to remove the chromium-based thin film from the entire surface of the thin film for pattern formation.

The present invention covers an aspect in which the thin film for pattern formation comprises a light-shield film having a stacked structure of at least two layers of a light-shield layer and a front-face antireflection layer from a side of the transparent substrate (Structure 5).

When the light-shield film has a two-layer stacked structure of a light-shield layer and a front-face antireflection layer, the light-shield layer is required to have a function of preventing rear-face reflection (reflection of exposure light at an interface between the transparent substrate and the light-shield layer).

Furthermore, the light-shield film may have a three-layer stacked structure including a rear-face antireflection layer on the light-shield near the transparent substrate. In this case, since the rear-face antireflection layer has a rear-face antireflection function, film design of the light-shield layer can be made in thoughtful consideration of ensuring the optical density. The light-shield film may be a single-layer composition gradient film. The front-face antireflection film, the light-shield layer, and the rear-face antireflection film may also be a composition gradient film.

The present invention covers an aspect in which
the thin film for pattern formation comprises a half-tone type phase shift film,
the chromium-based thin film and the thin film for pattern formation have a stacked structure with an optical density of at least 2.5, and
the chromium-based thin film is removed from an area other than a light-shield band area around the transfer pattern in the process of removing the chromium-based thin film by etching (Structure 7).

In this case, the chromium-based thin film has a function of providing light-shield capability (optical density) in the light-shield band area in addition to a function of an etching mask.

In a case of a half-tone type phase shift mask, the optical density of the light-shield band area should be at least 2.5. According to Structure 7, this requirement is met.

With Structure 7, the chromium-based thin film may be left on a portion of the half-tone type phase shift film in the transfer pattern area that needs a light-shield patch with a large film pattern.

In the present invention, the half-tone type phase shift film (semitransparent film) may have a single-layer structure, a two-layer structure including a low-transmittance layer and a high-transmittance layer, or a multilayer structure.

The half-tone type phase shift film includes a type of high transmittance. For example, the type of high transmittance refers to a type having a transmittance of 10% to 30%, which is relatively higher than a transmittance of a general type, which is lower than 1% to 10%.

The present invention covers an aspect in which the transition metal in the thin film for pattern formation is molybdenum (Structure 8).

As described above, molybdenum is likely to become ($MoO_3$) through bonding to oxygen or ozone. Since $MoO_3$ is a vaporizable substance, the present invention, which suppresses an affected layer at a sidewall portion of a pattern, can function significantly in an effective manner.

In the present invention, the light-shield layer of the light-shield film is preferably formed of a material having extremely high light-shield capability. It is preferable to form the light-shield layer of a material having light-shield capability higher than that of chromium. The material containing a transition metal and silicon has light-shield capability higher than chromium.

With regard to the optical density of the material containing molybdenum as a transition metal and silicon, a ratio expressed in percentage that is obtained by dividing the content of molybdenum [atomic %] by the total content of molybdenum and silicon [atomic %] (hereinafter referred to as a Mo/(Mo+Si) ratio) tends to hit the ceiling at a certain value. The Mo/(Mo+Si) ratio that hits the ceiling somewhat varies depending upon the content of other elements (nitrogen or the like) in the material but does not become higher than 40%. The chemical resistance and cleaning resistance (to alkali cleaning and hot water cleaning in particular) of the material containing molybdenum and silicon is problematically lowered in a case of a high molybdenum content. In consideration of those facts, it is preferable to set an permissible upper limit of the Mo/(Mo+Si) ratio for the light-shield layer containing molybdenum and silicon to be 40%, with which the minimum required chemical resistance and cleaning resistance can be ensured for use of a transfer mask.

Meanwhile, the optical density varies depending upon the content of other elements in the light-shield layer. Therefore, the lower limit of the Mo/(Mo+Si) ratio differs between a light-shield film having a two-layer stacked structure and a light-shield film having a three-layer stacked structure.

In a case of a light-shield film having a three-layer stacked structure including the rear-face antireflection layer, the light-shield layer, and the front-face antireflection film, the light-shield layer is not required to have a rear-face antireflection function or a front-face antireflection function. Therefore, the light-shield layer does not need to substantially contain oxygen or nitrogen. In this case, the light-shield film can sufficiently maintain an optical density of at least 2.5 with a small film thickness (not more than 60 nm) even if the lower limit of the Mo/(Mo+Si) ratio is 9%.

Meanwhile, in a case of a light-shield film having a two-layer stacked structure including the light-shield layer and the front-face antireflection film, the light-shield layer is required to have a rear-face antireflection function. Therefore, the nitrogen content in the film should be 30% or less. In this case, the light-shield film can sufficiently maintain an optical density of at least 2.5 when the lower limit of the Mo/(Mo+Si) ratio is set to be 15%.

The light-shield film containing a material to which a transition metal other than molybdenum is applied roughly shows the same tendency. Furthermore, the oxygen content in the light-shield layer lowers the light-shield capability to a considerably larger degree as compared to the nitrogen content. The film thickness required for the light-shield layer becomes larger in proportion to the oxygen content. Nitrogen can solely reduce a rear-face reflectance to exposure light. Therefore, the oxygen content of the light-shield layer is preferably lower than 10 atomic %. More preferably, the light-shield layer substantially contains no oxygen (to such a degree that oxygen contained because of contamination or the like is permissible).

In the present invention, the front-face antireflection film of the light-shield film preferably contains a material including at least one element selected from oxygen and nitrogen as principal components in addition to the transition metal and silicon.

Specifically, it is preferable to use a material containing a transition metal (M) and silicon as principal components (MSiO, MSiN, MSiON, MSiOC, MSiCN, MSiOCN, or the like) for the front-face antireflection film. Among others, MSiO and MSiON are preferable from the viewpoint of the chemical resistance and the heat resistance. MSiON is preferable from the viewpoint of the defective quality of mask blanks.

In a case where MoSiON, MoSiO, MoSiN, MoSiOC, or MoSiOCN is applied to the front-face antireflection film according to the present invention, the cleaning resistance, particularly the resistance to alkali (ammonia water or the like) or hot water, is lowered as the Mo content increases. From this point of view, the Mo content should be as low as possible in the front-face antireflection film of MoSiON, MoSiO, MoSiN, MoSiOC, MoSiOCN, or the like.

Furthermore, it has been found that, when a heat treatment (annealing) is performed at a high temperature for the purpose of stress control, a phenomenon of blurring (clouding) of the surface of the film occurs if the Mo content is high. This is conceivably because MoO is deposited on the surface of the film. In order to avoid such a phenomenon, the Mo content in the front-face antireflection film is preferably lower than 10 atomic % in the front-face antireflection film of MoSiON, MoSiO, MoSiN, MoSiOC, MoSiOCN, or the like. However, if the Mo content is excessively low, overdischarge occurs notably at the time of DC sputtering, thereby increasing the frequency of occurrence of defects. Accordingly, it is preferable to contain Mo in such a range that sputtering can properly be conducted. In other deposition technology, deposition may be performed without Mo contained.

There is a strong need for ensuring that the front-face reflectance of the light-shield film to ArF exposure light is 30% or less. The front-face reflectance of the light-shield film to ArF exposure light is preferably 25% or less. It is the most preferable to ensure 20% or less as long as the film thickness of the entire light-shield film is within a permissible range.

Furthermore, in order to suppress the front-face reflectance to a predetermined value or less, the film thickness of the front-face antireflection film is preferably larger than 5 nm. Moreover, the front-face antireflection film preferably has a film thickness of at least 7 nm in order to have a lower reflectance. Furthermore, in consideration of the production stability or the film removal of the front-face antireflection film because of repeated mask cleaning after production of the transfer mask, the front-face antireflection film preferably has a film thickness of at least 10 nm. In consideration of reduction of the thickness of the entire light-shield film, the front-face antireflection film, which makes a small contribution to the optical density of the light-shield film, preferably has a film thickness of 20 nm or less, more preferably 15 nm or less.

There is a strong need for ensuring that the rear-face reflectance of the light-shield film to ArF exposure light is 40% or less. The rear-face reflectance of the light-shield film to ArF exposure light is preferably 35% or less. It is the most preferable to ensure 30% or less as long as the film thickness of the entire light-shield film is within a permissible range.

In a case of a light-shield film having a three-layer stacked structure including a rear-face antireflection layer, the film thickness of the rear-face antireflection layer is preferably larger than 5 nm in order to suppress the rear-face reflectance to a predetermined value or less. Furthermore, the rear-face antireflection layer preferably has a film thickness of at least 7 nm in order to have a lower reflectance. In consideration of reduction of the thickness of the entire light-shield film, the rear-face antireflection layer, which makes a small contribution to the optical density of the light-shield film, preferably has a film thickness of 15 nm or less, more preferably 12 nm or less.

In the present invention, the chromium-based thin film may be a simple substance of chromium or may include chromium and at least one element of oxygen, nitrogen, carbon, and hydrogen (a film containing chromium as a principal component or a material containing Cr).

Among others, it is preferable for the chromium-based thin film to be formed of a material containing, as a principal component, either one of chromium nitride, chromium oxide, chromium oxynitride, and chromium carboxynitride. The chromium-based thin film may have a single-layer structure or a multilayer structure of the aforementioned film materials. The multilayer structure may be a multilayer structure in which different components are formed in stages or may be a film structure in which components varies continuously.

The present invention covers an aspect in which the chromium content in the chromium-based thin film is 45 atomic % or less.

When the chromium content in the film is 45 atomic % or less, the etching rate of the chromium-based thin film can be enhanced for reducing the film thickness of the resist.

The etching rate of a Cr-based material by a chlorine-based gas increases as oxidation proceeds. Furthermore, as nitriding proceeds, the etching rate of a Cr-based material by a chlorine-based gas is also improved, though not so much as in the oxidation. Therefore, it is preferable to enhance the degree of oxidation and nitriding.

From the viewpoint of improving the defective quality of the film, it is preferable to use chromium carboxynitride or chromium carboxide. Furthermore, from the viewpoint of the controllability of stress (the capability of forming a low-stress film), it is preferable to use chromium carboxynitride (CrOCN).

A method of manufacturing a semiconductor device according to the present invention is characterized by using a transfer mask produced by the method of manufacturing a transfer mask as described in Structure 6 to form a circuit pattern on a semiconductor wafer (Structure 9).

The method of manufacturing a semiconductor device according to the present invention covers an aspect in which the circuit pattern formed on the semiconductor wafer includes a circuit pattern following a DRAM hp 45-nm generation (Structure 10).

A method of manufacturing a semiconductor device according to the present invention is characterized by using a transfer mask produced by the method of manufacturing a transfer mask as described in Structure 7 or 8 to form a circuit pattern on a semiconductor wafer (Structure 11).

With use of a transfer mask produced by a method of manufacturing a transfer mask according to the present invention, a larger number of semiconductor devices having a circuit pattern with high precision can continuously be manufactured with use of the same transfer mask as compared to the conventional technology.

In the present invention, the dry etching of the thin film containing a transition metal and silicon may use a fluorine-based gas, such as $SF_6$, $CF_4$, $C_2F_6$, or $CHF_3$, or a mixture gas of such a fluorine-based gas and He, $H_2$, $N_2$, Ar, $C_2H_4$, $O_2$, or the like.

In the present invention, it is preferable to use a dry etching gas of a mixture gas including a chlorine-based gas and an oxygen gas for dry etching of the chromium-based thin film. This is because it is possible to enhance the dry etching rate, shorten the dry etching time, and form a light-shield film pattern with a good cross-sectional profile by dry-etching the chromium-based thin film formed of a material containing chromium and an element such as oxygen or nitrogen with the aforementioned dry etching gas. Examples of the chlorine-based gas used as the dry etching gas include $Cl_2$, $SiCl_4$, HCl, $CCl_4$, and $CHCl_3$.

In the present invention, the resist is preferably a chemical amplification type resist. This is because a chemical amplification type resist is suitable for high-precision processing.

In the present invention, the resist is preferably a resist for electron beam lithography. This is because a resist for electron beam lithography is suitable for high-precision processing.

The present invention is applicable to a mask blank for electron beam lithography to form a resist pattern by electron beam lithography.

In the present invention, examples of the substrate include a synthesis quartz substrate, a $CaF_2$ substrate, a soda lime glass substrate, a no-alkali glass substrate, and an aluminosilicate glass substrate.

In the present invention, examples of the transfer mask include a binary mask using no phase shift effect and a phase shift mask. The transfer mask may include a reticle.

The phase shift mask includes a half-tone type (tritone type) phase shift mask, a Levenson type phase shift mask, an assist pattern type phase shift mask, a self-aligned (edge-enhanced) phase shift mask, and the like.

Example 1 And Comparative Example 1

(Production of a Mask Blank)

Figure 6:
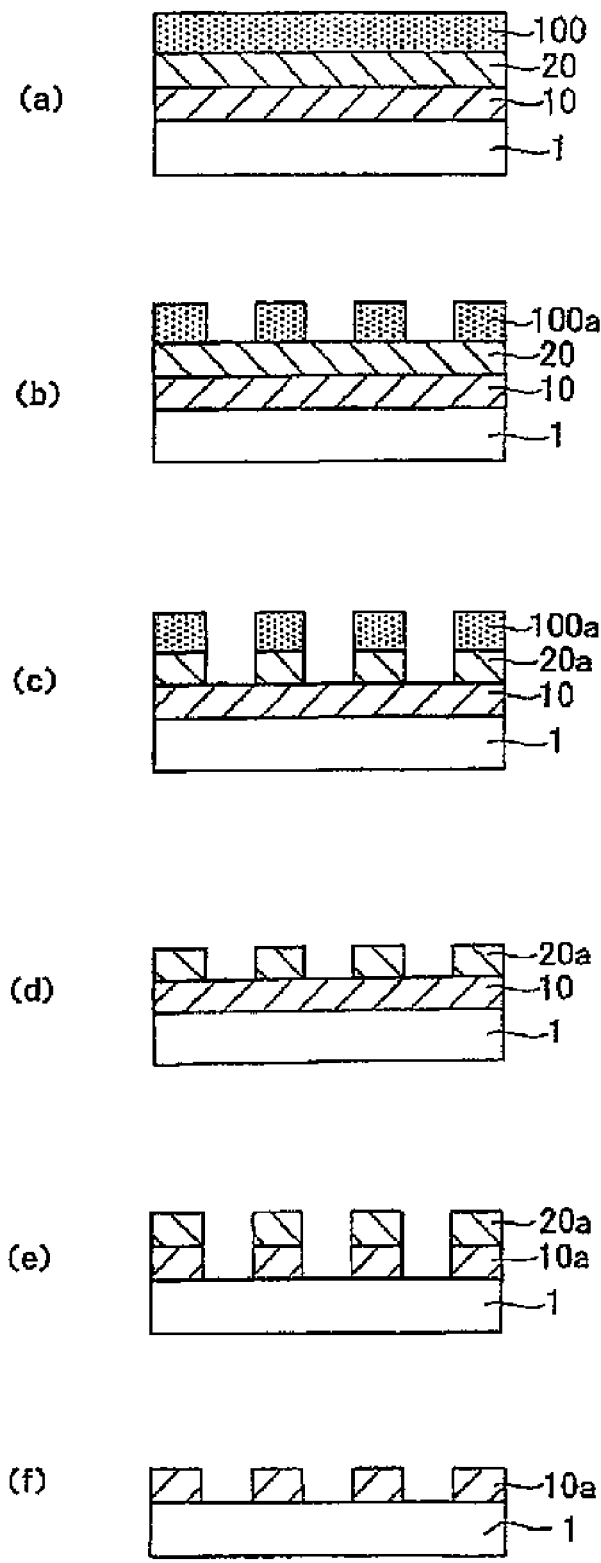
FIG. 6 shows, in (a) to (f), schematic cross-sectional views explanatory of a manufacturing process of a transfer mask according to one example of the present invention.

FIG. 6 (a) is a cross-sectional view of a binary mask blank in Example 1.

A synthesis quartz glass substrate having a size of 6 inches square and a thickness of 0.25 inch was used as a transparent substrate 1. A MoSiN film (light-shield layer) and a MoSiON film (front-face antireflection layer) were respectively formed as a light-shield film 10 of a film for pattern formation on the transparent substrate 1 so as to have a two-layer stacked structure.

Specifically, a light-shield layer (MoSiN film, Mo:Si:N=14.7 atomic %:56.2 atomic %:29.1 atomic %) was formed on the transparent substrate 1 so as to have a film thickness of 50 nm by reactive sputtering (DC sputtering) that used a mixed target of molybdenum (Mo) and silicon (Si) (Mo:Si=21 atomic %:79 atomic %) under a mixture gas atmosphere of argon (Ar) and nitrogen ($N_2$).

Next, a front-face antireflection layer (MoSiON film, Mo:Si:O:N=2.6 atomic %:57.1 atomic %:15.9 atomic %:24.4 atomic %) was formed on the light-shield layer so as to have a film thickness of 10 nm by reactive sputtering (DC sputtering) that used a mixed target of molybdenum (Mo) and silicon (Si) (Mo:Si=4 atomic %:96 atomic %) under a mixture gas atmosphere of argon (Ar), oxygen ($O_2$), nitrogen ($N_2$), and helium (He).

The Rutherford backscattering spectroscopy analysis was used to analyze elements of each layer (in the light-shield film).

The total film thickness of the light-shield film 10 was 60 nm. The optical density (OD) of the light-shield film 10 was 3.0 with ArF excimer laser exposure light having a wavelength of 193 nm.

Then the substrate was subjected to a heat treatment (annealing process) at 450° C. for 30 minutes.

Next, an etching mask film 20 was formed as a chromium-based thin film on the light-shield film 10 (FIG. 6a).

Specifically, an etching mask film (CrOCN film, Cr:O:C:N=33.0 atomic %:38.9 atomic %:11.1 atomic %:17.0 atomic %) was formed so as to have a film thickness of 15 nm by a magnetron sputtering apparatus using a chromium target under a mixture gas atmosphere of argon (Ar), carbon dioxide ($CO_2$), nitrogen ($N_2$), and helium (He).

The Rutherford backscattering spectroscopy analysis was used for elemental analysis of the CrOCN film (etching mask film).

Thus, a binary mask blank in which a light-shield film for ArF excimer laser exposure had been formed was obtained. Furthermore, a required number of binary mask blanks were manufactured in the same manner as described above.

(Production of a Transfer Mask)

A chemical amplification type positive-working photoresist 100 for electron beam lithography (exposure) (PRL009: FUJIFILM Electronic Materials Co., Ltd.) was applied onto the etching mask film 20 of the mask blank so as to have a film thickness of 100 nm by a spin coating method (FIG. 6a).

Then a desired pattern was drawn on the resist film 100 with an electron beam lithography apparatus. After that, development was performed with a predetermined developing solution so as to form a resist pattern 100a (FIG. 6b).

Next, while the resist pattern 100a was used as a mask, dry etching was conducted on the etching mask film 20 so as to form a pattern 20a of the etching mask film (FIG. 6c). A mixture gas of $Cl_2$ and $O_2$ ($Cl_2$:$O_2$=4:1) was used as the dry etching gas.

Then the remaining resist pattern 100a was removed (FIG. 6d).

Subsequently, while the pattern 20a of the etching mask film was used as a mask, dry etching was conducted on the light-shield film 10 with use of a mixture gas of $SF_6$ and He so as to form a light-shield film pattern 10a (FIG. 6e).

Thereafter, dry etching was conducted on the pattern 20a of the etching mask film with use of a mixture gas of $Cl_2$ and $O_2$ ($Cl_2$:$O_2$=4:1) so that the pattern 20a of the etching mask film was separated and removed (FIG. 6f). The period of time for Cr separation was 25 seconds. Furthermore, all of the produced binary mask blanks were subjected to the same processes as described above so as to produce transfer masks (binary masks) having the same transfer pattern.

Next, a plurality of transfer masks produced in the above manner was subjected to a process of cleaning with an alkali solution, a process of cleaning with hot water, and a process of cleaning with water containing ozone in order named.

The process of cleaning with an alkali solution employed a solution of ammonium hydroxide ($NH_4OH$ having a concentration of 25 wt %):hydrogen peroxide ($H_2O_2$ having a concentration of 30 wt %):water ($H_2O$)=2:1:4 (volume ratio) at a room temperature. The processing time was set to be 0 minute (i.e., no processing) in Comparative Example 1-1, 5 minutes in Comparative Example 1-2, 10 minutes in Comparative Example 1-3, 15 minutes in Example 1-1, and 30 minutes in Example 1-2.

The process of cleaning with hot water employed ion-exchanged water (DI water: deionized water) having a temperature of 90° C. The processing time was set to be 0 minute (i.e., no processing) in Comparative Example 1-1, 5 minutes in Comparative Example 1-2, 10 minutes in Comparative Example 1-3, 15 minutes in Example 1-1, and 30 minutes in Example 1-2.

The process of cleaning with water containing ozone employed water containing 50 ppm of ozone at a room temperature. The processing time was set to be 0 minute (i.e., no processing) in Comparative Example 1-1, 5 minutes in Comparative Example 1-2, 10 minutes in Comparative Example 1-3, 15 minutes in Example 1-1, and 30 minutes in Example 1-2.

Thus, transfer masks were produced from the mask blanks for Example 1-1, Example 1-2, Comparative Example 1-1, Comparative Example 1-2, and Comparative Example 1-3.

(Measurement of the Amount of Removal of a Sidewall by Cleaning)

In the cleaning process of the transfer mask, the amount of reduction of the width of the transfer pattern of the light-shield film (the thin film for pattern formation) by the cleaning was examined.

The amount of CD variation (=(CD prior to the cleaning)−(CD after the cleaning)) was measured for each of six lines, each having a width of 180 nm, equally arranged on the plane, and an average of the six lines was calculated as the amount of reduction of the width of the transfer pattern of the light-shield film by the cleaning.

As a result, the amount of removal of the sidewalls by the cleaning at both sides of the line having a width of 180 nm was 0 nm in Comparative Example 1-1 (i.e., no cleaning process), 1.3 nm in Comparative Example 1-2 (in which each cleaning time was 5 minutes), 2.9 nm in Comparative Example 1-2 (in which each cleaning time was 10 minutes), 3.9 nm in Example 1-1 (in which each cleaning time was 15 minutes), and 6.6 nm in Example 1-2 (in which each cleaning time was 30 minutes).

(CD Variation by Irradiation of ArF Excimer Laser)

The amount of CD variation of the transfer masks thus obtained by irradiation of an ArF excimer laser (having a wavelength of 193 nm) was examined.

The irradiation conditions were as follows: The repetition frequency was 300 Hz. The pulse energy was 16 mJ/cm$^2$/pulse. The accumulated amount of irradiation was 40 kJ/cm$^2$.

The accumulated amount of irradiation of 40 kJ/cm$^2$ corresponds to exposure transfer of a transfer pattern to resist films for 150,000 wafers with use of a transfer mask.

For measurement of CD, the amount of CD variation (=(CD after the cleaning)−(CD prior to the cleaning)) was measured for each of six lines, each having a width of 180 nm, equally arranged on the plane, and an average of the six lines was calculated.

As a result, the amount of CD variation (average) was 19.5 nm in Comparative Example 1-1 (i.e., no cleaning process), 15.9 nm in Comparative Example 1-2 (in which each cleaning time was 5 minutes), 12.1 nm in Comparative Example 1-3 (in which each cleaning time was 10 minutes), 4.7 nm in Example 1-1 (in which each cleaning time was 15 minutes), and 3.9 nm in Example 1-2 (in which each cleaning time was 30 minutes).

FIG. 1 shows the relationship between the amount of reduction of the width of a transfer pattern of a light-shield film (nm) by cleaning and the amount of CD variation (nm) by irradiation of an ArF excimer laser.

When sidewalls are removed by cleaning until the pattern width of the MoSi-based light-shield film is reduced by 1.3 nm or the space width is increased by 1.3 nm, the CD variation (increase of CD) can be reduced from 19.5 nm to about 15.9 nm as compared to Comparative Example 1-1 (i.e., no cleaning process). Nevertheless, the reduction of the CD variation is insufficient.

When sidewalls are removed by cleaning until the pattern width of the MoSi-based light-shield film is reduced by 2.9 nm or the space width is increased by 2.9 nm, the CD variation (increase of CD) can be reduced from 19.5 nm to about 12.1 nm as compared to Comparative Example 1-1 (i.e., no cleaning process). Thus, the CD variation can be reduced to about ½. Nevertheless, the amount of CD variation is not less than 10 nm and is still large.

When sidewalls are removed by cleaning until the pattern width of the MoSi-based light-shield film is reduced by 3.9 nm or the space width is increased by 3.9 nm, the CD variation (increase of CD) can be reduced from 19.5 nm to 4.7 nm as compared to Comparative Example 1-1 (i.e., no cleaning process). Thus, the CD variation can be reduced to about ¼. This case exhibits a remarkable advantageous effect.

Comparative Example 2

The same processes as Example 1 were performed except that an acid cleaning process was added to a preceding stage of the process of cleaning with an alkali solution (i.e., an acid cleaning process was performed instead of the cleaning process with an alkali solution after the pattern 20a of the etching mask film made of a chromium-based material had been removed by etching) and that the process of cleaning with water containing ozone was omitted.

The acid cleaning process employed a solution of sulfuric acid ($H_2SO_4$ having a concentration of 98 wt %):hydrogen peroxide ($H_2O_2$ having a concentration of 30 wt %):=4:1 (volume ratio) that had been heated to 90° C. The pressing time was set to be 10 minutes.

The amount of reduction of the width of the transfer pattern by the cleaning was examined in the same manner as in Example 1. The amount of CD variation by irradiation of an ArF excimer laser was examined under the same conditions as in Example 1. As a result, the amount of CD variation (average) of the respective lines (6 points arranged equally on the plane) was in a range of 11 nm to 19 nm.

(Manufacture of a Semiconductor Device)

Next, transfer masks on which a transfer pattern of the DRAM hp 45-nm generation was formed in the thin film for pattern formation were produced in the same manner as in Examples 1-1 and 1-2, Comparative Examples 1-1 to 1-3, and Comparative Example 2. Irradiation of an ArF excimer laser (having a wavelength of 193 nm) was performed on the thin film for pattern formation of each of the produced transfer masks under the same conditions as in Example 1-1. Thus, there were prepared transfer masks having a state in which exposure transfer of a transfer pattern had been performed on resist films for 150,000 semiconductor wafers. A process of exposure transfer of a transfer pattern was performed on a resist film of each of the prepared transfer masks on a semiconductor wafer. An immersion type exposure apparatus having a light source of an ArF excimer laser was used as the exposure apparatus. Specifically, each of the prepared transfer masks was set on a mask stage of the exposure apparatus. Exposure transfer was performed on a resist film for ArF immersion exposure that had been formed on the semiconductor wafer. A predetermined development process was performed on the resist film subjected to the exposure so as to form a resist pattern. Furthermore, a circuit pattern of the DRAM half-pitch (hp) 45-nm generation was formed on the semiconductor wafer with use of the resist pattern.

When the obtained circuit pattern on the semiconductor wafer was observed with an electron microscope (TEM), the circuit pattern manufactured with the transfer masks produced under the conditions of Examples 1-1 to 1-2 satisfactorily met the specifications required for a circuit pattern of the DRAM half-pitch (hp) 45-nm generation. In other words, it was confirmed that the transfer masks of Examples 1-1 to 1-2 could sufficiently transfer a circuit pattern of the DRAM half-pitch (hp) 45-nm with accuracy onto a semiconductor wafer even though they had been subjected to exposure transfer for 150,000 semiconductor wafers.

In contrast, with regard to circuit patterns manufactured with the transfer masks produced under the conditions of Comparative Examples 1-1 to 1-3 and Comparative Example 2, the amount of CD variation from the designed value was large. Thus, those circuit patterns could not meet the specifications required for a circuit pattern of the DRAM half-pitch (hp) 45-nm generation. In other words, it was confirmed that the transfer masks of Comparative Examples 1-1 to 1-3 and Comparative Example 2 could not transfer a circuit pattern of the DRAM half-pitch (hp) 45-nm with accuracy onto a semiconductor wafer after they had been subjected to exposure transfer for 150,000 semiconductor wafers.

DESCRIPTION OF REFERENCE NUMERALS 1 transparent substrate
2 thin film for pattern formation
2a affected layer
10 light-shield film
20 etching mask film
100 resist film

The invention claimed is:

1. A method of manufacturing a transfer mask with use of a mask blank in which a thin film for pattern formation and a chromium-based thin film are stacked on a transparent substrate in this order, the thin film for pattern formation being made of material containing silicon and a transition metal other than chromium, the chromium-based thin film being made of a material containing chromium, wherein:
the transfer mask is adapted to an exposure light having a wavelength of 200 nm or less; and
the transfer mask is produced by performing in the following order:
a process of forming a resist film having a transfer pattern on the chromium-based thin film,
a process of forming a transfer pattern in the chromium-based thin film with use of a mask of the resist film having the transfer pattern, a process of forming a transfer pattern in the thin film for pattern formation with use of a mask of the chromium-based thin film having the transfer pattern, and
a process of removing the chromium-based thin film by etching; and
a cleaning process of at least one of alkali solution cleaning, hot water cleaning, and ozone-containing water cleaning on the produced transfer mask until a width of a sidewall of the transfer pattern of the thin film for pattern formation is reduced by 4 nm or a space width of a sidewall of the thin film for pattern formation is increased by 4 nm.

2. The method of manufacturing a transfer mask as recited in claim 1, wherein the cleaning process includes conducting the alkali solution cleaning, the hot water cleaning, and the ozone-containing water cleaning in order named.

3. The method of manufacturing a transfer mask as recited in claim 1, wherein the alkali solution comprises an aqueous solution containing ammonia and hydrogen peroxide.

4. The method of manufacturing a transfer mask as recited in claim 1, wherein:
the thin film for pattern formation comprises a light-shield film having an optical density of 2.5 or more, and
the chromium-based thin film is entirely removed by the removal process of etching.

5. The method of manufacturing a transfer mask as recited in claim 4, wherein the thin film for pattern formation comprises a light-shield film having a stacked structure of at least two layers of a light-shield layer and a front-face antireflection layer from a side of the transparent substrate.

6. A method of manufacturing a semiconductor device, using a transfer mask produced by the method of manufacturing a transfer mask as recited in claim 4 to form a circuit pattern on a semiconductor wafer.

7. The method of manufacturing a transfer mask as recited in claim 1, wherein the thin film for pattern formation has a transfer pattern following a DRAM hp 45-nm generation.

8. A method of manufacturing a semiconductor device using a transfer mask produced by the method of manufacturing a transfer mask as recited in claim 7 to form a circuit pattern on a semiconductor wafer.

9. The method of manufacturing a semiconductor device as recited in claim 8, wherein the circuit pattern formed on the semiconductor wafer includes a circuit pattern following a DRAM hp 45-nm generation.

10. The method of manufacturing a transfer mask as recited in claim 1, wherein:
the thin film for pattern formation comprises a half-tone type phase shift film,
the chromium-based thin film and the thin film for a transfer pattern have a stacked structure with an optical density of at least 2.5, and
the chromium-based thin film is removed from an area other than a light-shield band area around the transfer pattern in the process of removing the chromium-based thin film by etching.

11. A method of manufacturing a semiconductor device, using a transfer mask produced by the method of manufacturing a transfer mask as recited in claim 10 to form a circuit pattern on a semiconductor wafer.

12. The method of manufacturing a transfer mask as recited in claim 1, wherein the transition metal in the thin film for pattern formation is molybdenum.

13. A method of manufacturing a semiconductor device, using a transfer mask produced by the method of manufacturing a transfer mask as recited in claim 12 to form a circuit pattern on a semiconductor wafer.

14. The method of manufacturing a transfer mask as recited in claim 1, wherein the cleaning process is an initial cleaning that is performed after the process of removing the chromium-based thin film by etching.

15. The method of manufacturing a transfer mask as recited in claim 1, wherein an initial cleaning that is performed after the process of removing the chromium-based thin film by etching no contains acid cleaning.

16. The method of manufacturing a transfer mask as recited in claim 1, wherein the chromium-based thin film is made of a material which is a simple substance of chromium or which includes chromium and at least one element of oxygen, nitrogen, carbon, and hydrogen.

17. The method of manufacturing a transfer mask as recited in claim 1, wherein the transition metal contained in the thin film for pattern formation is one of tantalum, tungsten, titanium, zirconium, vanadium, niobium, nickel, palladium, ruthenium, rhodium, and hafnium, or an alloy thereof.

* * * * *